United States Patent [19]

Maurer et al.

[11] 4,387,470
[45] Jun. 7, 1983

[54] RECEIVER INPUT STAGE WITH AN IMPROVEMENT OF THE SIGNAL TO NOISE RATIO

[75] Inventors: Robert Maurer, Saarbrücken; Hans P. Petry, Mettlach, both of Fed. Rep. of Germany

[73] Assignee: Licentia Patent-Verwaltungs-G.m.b.H., Frankfurt am Main, Fed. Rep. of Germany

[21] Appl. No.: 104,022

[22] Filed: Dec. 17, 1979

[30] Foreign Application Priority Data

Dec. 15, 1978 [DE] Fed. Rep. of Germany ....... 2854128

[51] Int. Cl.$^3$ .......................... H04B 1/26; H03C 3/06
[52] U.S. Cl. .................................... 455/257; 455/207; 455/208
[58] Field of Search ............... 455/257, 258, 263, 265, 455/67, 302, 314, 341, 290, 207, 208

[56] References Cited

U.S. PATENT DOCUMENTS

| | | | |
|---|---|---|---|
| 3,231,822 | 1/1966 | Tillotson | 455/258 |
| 3,238,460 | 3/1966 | Enloe | 455/258 |
| 3,428,900 | 2/1969 | Newton | 455/207 |
| 3,544,899 | 12/1970 | Gusyatinsky | 455/207 |
| 3,911,365 | 10/1975 | Maurer | 455/207 |
| 3,991,373 | 11/1976 | Maurer | 455/290 |
| 4,042,884 | 8/1977 | Querry | 455/208 |

OTHER PUBLICATIONS

Parametric Microwave Superheterodyne Receiver, By Maurer, et al., AEU, Band 26(1972), No. 11, pp. 475-480.
The Signal and Noise Properties of the Degenerated and Quasidengenerated Nonreciprocal Parametric Amplifier Without Circulators, By Maurer, AEU 24, (1970), No. 9, pp. 419-424.
Lower Sideband Parametric Converter with Frequency or Amplitude Modulated Signal and Pump Source, By R. Maurer, AEU 26, (1972), No. 1, pp. 1-10.
General Considerations About the Noise Figure for Active Two-Ports with Noise Figures F 1, By Maurer, AEU 26, (1972), No. 1, pp. 11-14.

Primary Examiner—Tommy P. Chin
Attorney, Agent, or Firm—Spencer & Kaye

[57] ABSTRACT

A receiver input circuit composed of an upper sideband parametric down converter for converting a high frequency input signal into an intermediate frequency; a signal demodulator having a signal input connected to the output of the converter; a controllable oscillator connected in a control loop with the converter and the demodulator for supplying the converter with a pump signal which follows the intermediate signal in frequency and phase and which has a frequency equal to twice the intermediate frequency such that the sum of the pump signal frequency and the intermediate frequency equals three times the intermediate frequency; and a real resistance terminating the converter at the image frequency corresponding to the established pump signal and intermediate frequencies, whereby the circuit has an available power gain greater than unity and an improved signal to noise ratio ahead of the demodulator.

5 Claims, 10 Drawing Figures

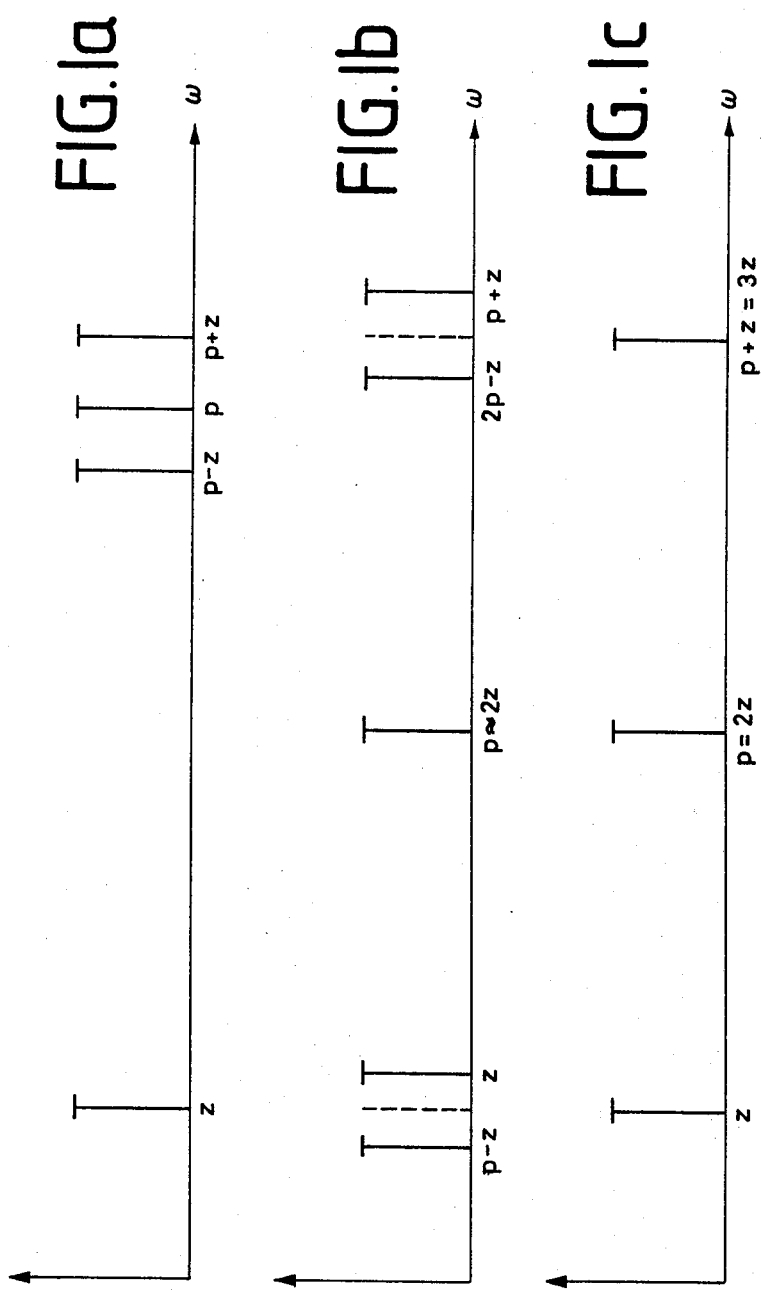

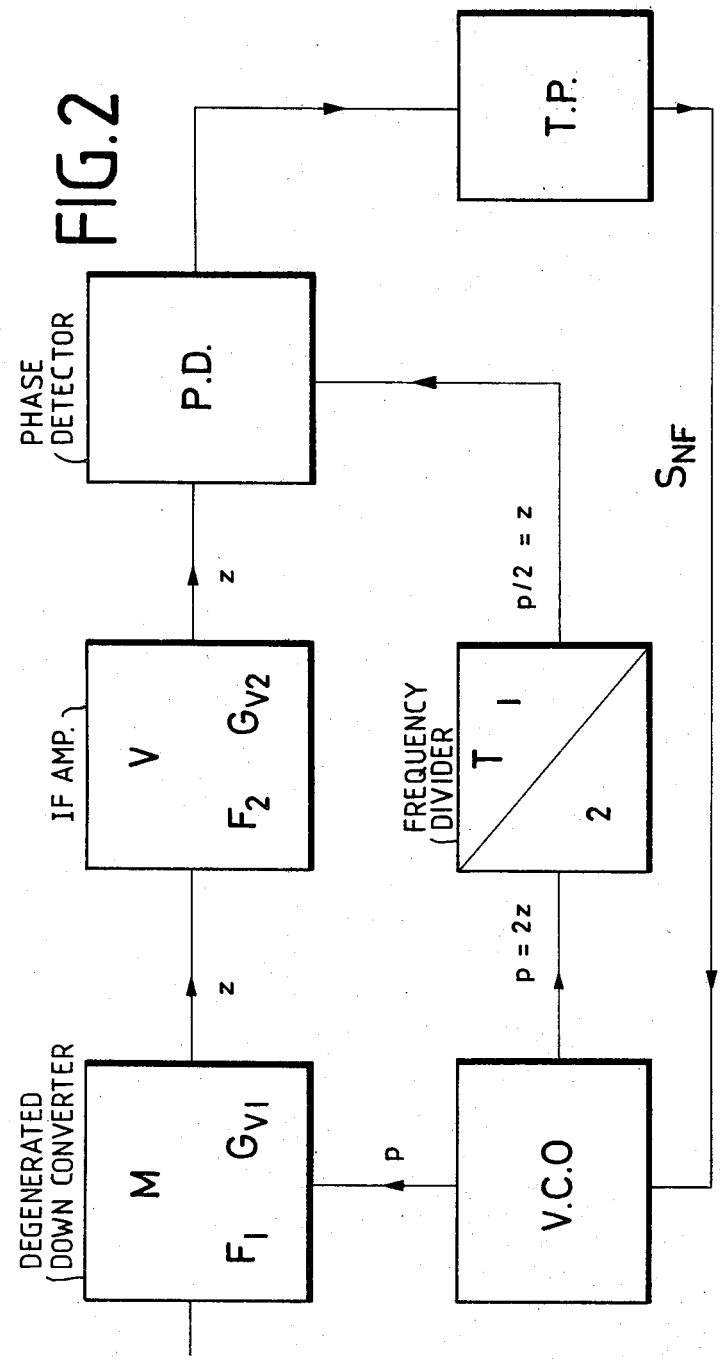

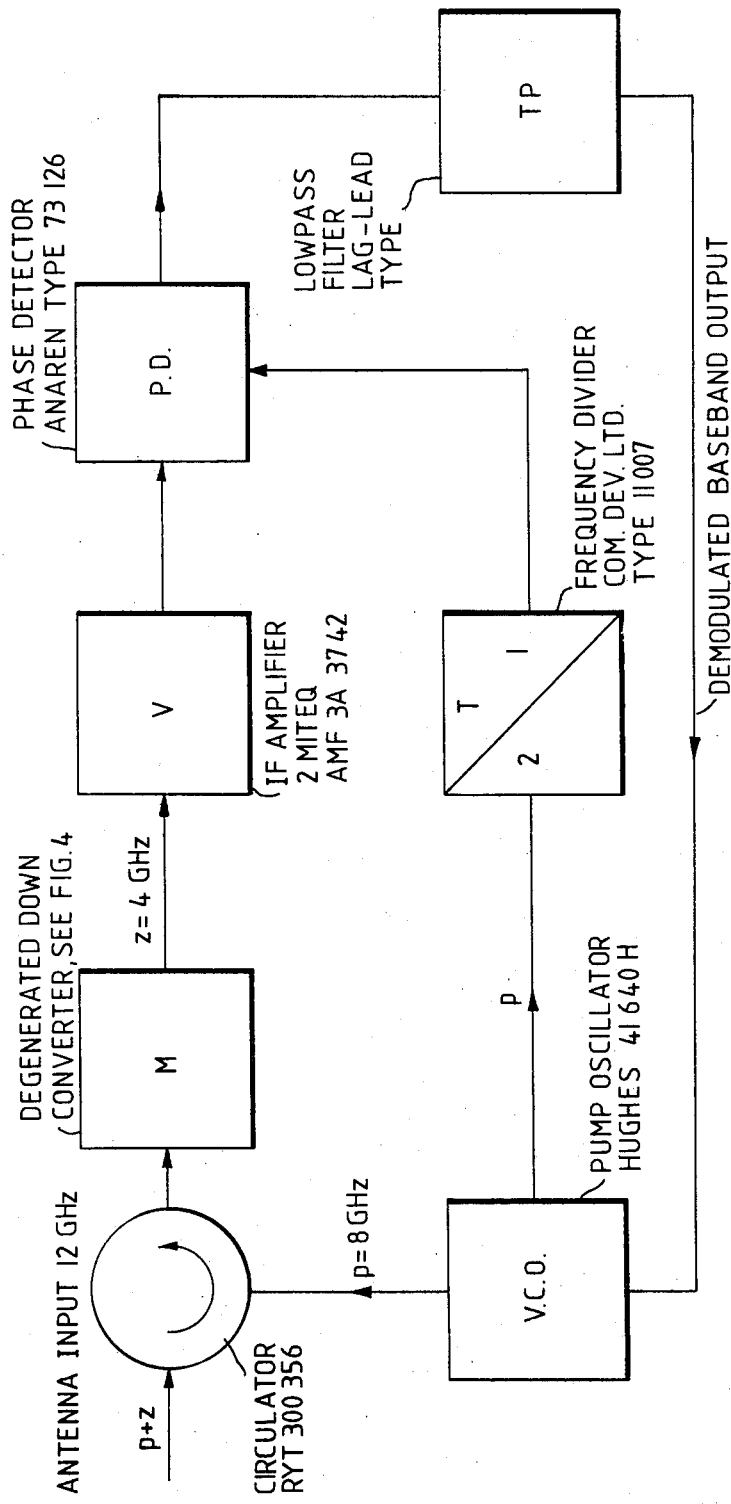

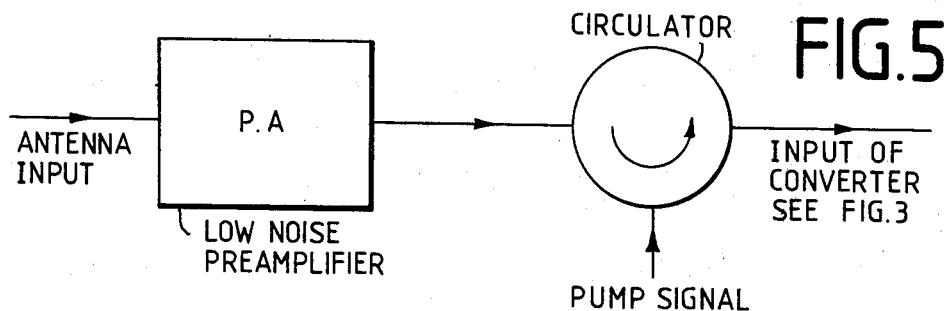
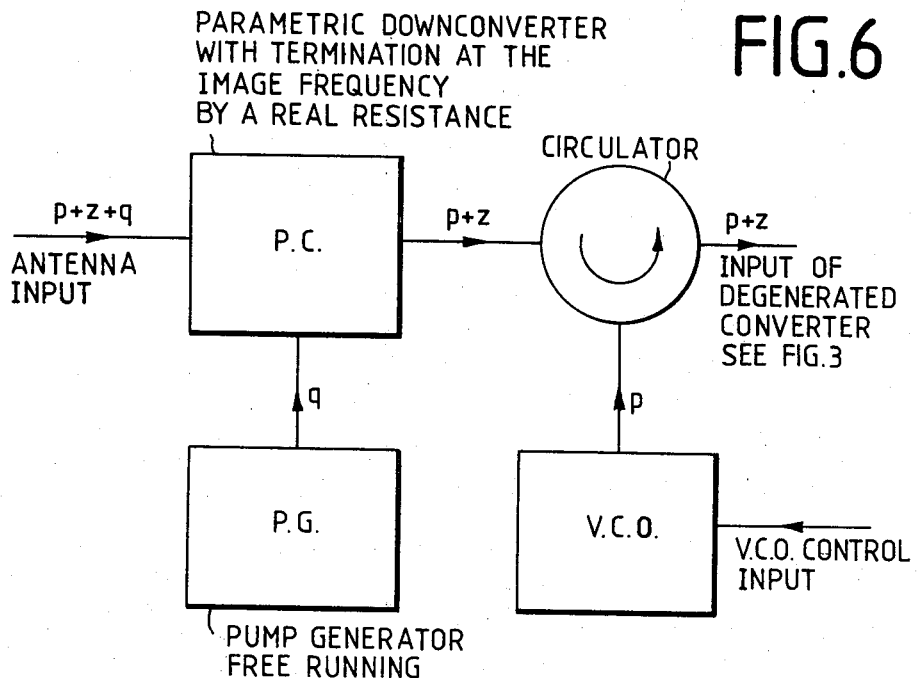
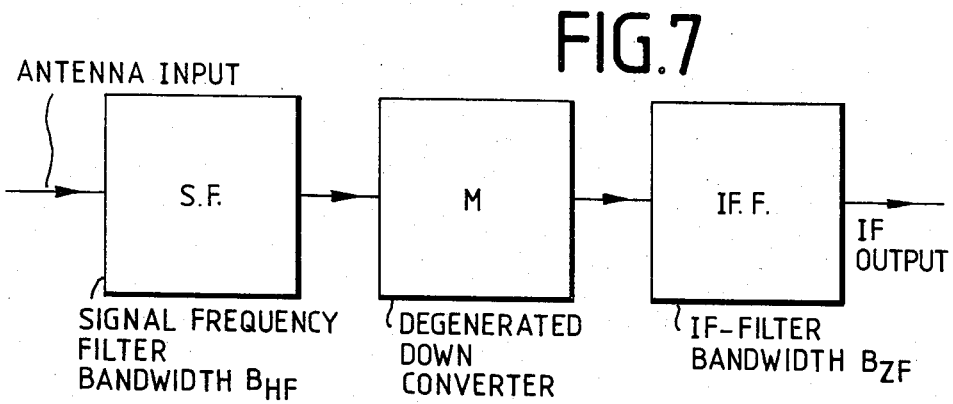

RECEIVER INPUT STAGE WITH AN IMPROVEMENT OF THE SIGNAL TO NOISE RATIO

BACKGROUND OF THE INVENTION

Parametric receiver input circuits, i.e. circuits with controlled susceptance, utilizing, for example, varactor diodes, are known to be superior in sensitivity to conventional receivers which employ converters with controlled conductance. Among the multitude of prior art variations of parametric circuits for receiver input stages, the following examples merit particular emphasis in connection with a coherent phase down converter:

1. Lower sideband down converters with AM or FM modulated pump source;
2. Nonreciprocal degenerated converter cascade amplifiers;
3. Upper sideband down converters with high conversion ratio and termination at the image frequency by a real resistance.

These examples are distinguished either by very low system noise temperature as in the case of example 3, above, or by an improved signal to noise ratio, as in the case of examples 1 and 2, above.

The mechanisms giving rise to these properties are already very well known. In particular, for systems according to examples 1 and 2, the term noise figure has to be defined in a more generalized way.

The achievement of the signal to noise ratio improvement (systems with $F<1$) can be explained with the aid of a generalized definition, as described in U.S. Pat. No. 3,911,365. Conventional systems are also included in the definition.

In the treatment of these types of receivers, it becomes evident that two characteristic properties are the major contributors to an improvement in the signal to noise ratio: firstly, the possibility of reducing the system bandwidth from the HF to the IF region, e.g. using a feedback connected FM receiver; and secondly a different amplification of the signal and noise energy, e.g. using a feedback connected AM receiver or converter cascade amplifier.

For system considerations in the microwave range it may be a drawback, however, for the first converter in the converter cascade amplifier to be an up converter, i.e. to be operated with a high pump frequency. The lower sideband down converter inverts the signal spectrum and can therefore not be used without further lower sideband conversions.

SUMMARY OF THE INVENTION

It is an object of the present invention to avoid the above-mentioned drawbacks of the prior art system concepts without eliminating their positive characteristics and to improve the signal to noise ratio between the converter input and output, while simultaneously making available a high power gain and low inherent noise.

These and other objects are achieved, according to the invention, by provision of a receiver input circuit comprising: an upper sideband parametric down converter for converting a high frequency input signal into an intermediate frequency signal; demodulating means having a signal input connected to the output of the converter; a controllable oscillator connected in a control loop with the converter and the demodulating means for supplying the converter with a pump signal which follows the intermediate signal in frequency and phase and which has a frequency equal to twice the intermediate frequency such that the sum of the pump signal frequency and the intermediate frequency equals three times the intermediate frequency; and means defining a real resistance at the converter image, or reflective, frequency terminating the converter, whereby the circuit has an available power gain greater than unity and an improved signal to noise ratio ahead of the demodulating means.

BRIEF DESCRIPTION OF THE DRAWING

FIGS. 1a, 1b and 1c are frequency diagrams illustrating the operation of three types of converters.

FIG. 2 is a block circuit diagram of a preferred embodiment of a receiver input circuit according to the invention.

FIG. 3 shows a 12 GHz synchronous receiver built around the degenerate down converter with commercially available components.

FIG. 5 describes the use of a low noise preamplifier in front of the degenerate converter.

FIG. 6 is a block circuit diagram of the cascade of a parametric down converter with termination at the image frequency with a real resistance and the degenerate down converter using the known V.C.O. for the phase-coherent converter and a free running pump-oscillator for the first converter.

FIG. 7 shows how the bandwidth from the HF to the IF level can be reduced using two filter stages and the above mentioned deviation compression.

DESCRIPTION OF THE PREFERRED EMBODIMENTS

Figure 4A:
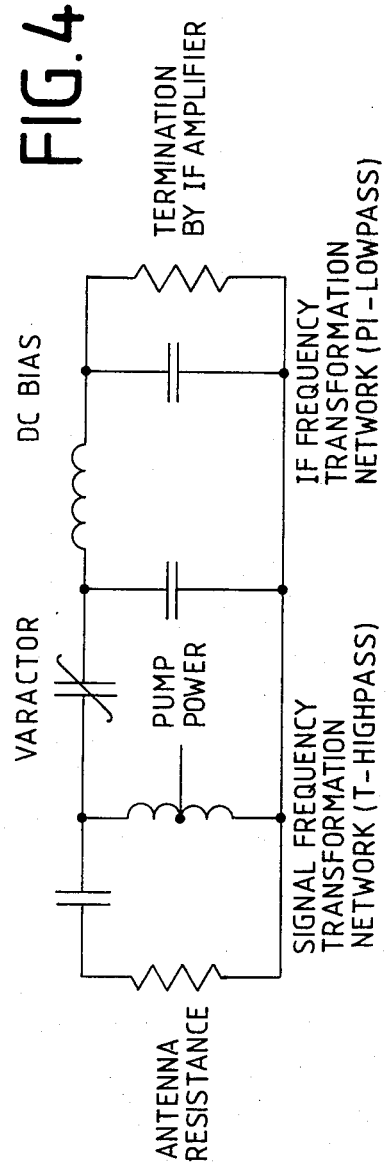
FIGS. 4a, 4b are realizable circuit diagrams of the degenerate parametric converter at low frequencies (FIG. 4a) and in the microwave region respectively (FIG. 4b).

FIG. 1a shows the relative frequency positions in converters having a high conversion ratio, FIG. 1b shows the relative frequency positions in quasidegenerated converters, and FIG. 1c shows the same for degenerated converters. The various frequency levels shown include the pump frequency p, the intermediate frequency z, the input circuit signal, or reflective, frequency $p+z$, the image frequency $p-z$, and the double conversion product $2p-z$.

FIG. 2 shows a coherent-phase receiver input circuit according to the invention with a degenerated down converter M. This down converter M is followed by an IF amplifier V the output of which is connected to a first input of a phase detector PD. The converter M is fed with a pumping voltage at the pumping frequency p by a voltage controlled pump oscillator VCO which is also connected, via a 2:1 frequency divider T, to a second input of the phase detector PD. The output of this phase detector leads to a lowpass filter TP at which a low frequency signal $S_{NF}$ can be obtained. The output of lowpass filter TP is connected to the control input of oscillator VCO. In the case of a frequency modulated signal at the converter input, the signal after the lowpass filter is the demodulated baseband signal.

The basis for the overall behavior of the circuit is the calculation of the low level signal conversion matrix of the converter for the case where the pump oscillator frequency p is approximately equal to the double intermediate frequency, i.e. the so-called quasidegenerated case shown in FIG. 1b. The degenerated or coherent phase case, respectively, is derived therefrom.

In the degenerated case, i.e. $p=2z$, $p+z=3z$, the phase control loop is settled and the five-frequency system of FIG. 1b changes to the three-frequency system of FIG. 1c. Evaluation of the above-mentioned conversion matrix shows that, due to the termination at the image frequency, which in the degenerated case is equal to the intermediate frequency, the IF circuit, as disclosed in U.S. Pat. No. 3,991,373 is deattenuated providing thus an available power gain $G_{v,m}$, which is greater than one. The magnitude of this gain depends on the phase relation between pump frequency and intermediate frequency. With resonant tuning of the circuits, the following relationship applies:

$$G_{v,m} = \frac{m}{(1+m)^2} \frac{(\gamma Q_{p+z})^2}{1 + \frac{p+z}{z} \frac{(\gamma Q_p + z)^2}{m+1} \left(1 + \frac{m+1}{\gamma Q} \cos\phi \right)}$$

where $m = R_{p+z}/R_D$ = the ratio of transformed generator resistance to equivalent resistance of the reactance diode, $\gamma Q_{p+z}$ is the dynamic quality factor of the reactance diode at the signal frequency, and $\phi$ is the phase difference between pump oscillator frequency and intermediate frequency.

With quadrature actuation by the phase control system, the phase angle $\phi=0$, and the available gain takes on its maximum value. In the no loss case this is $$G_{v,m} = z/(p+z) 1/(1-a),$$

where a represents the effective deattenuation and has a value in the vicinity of one, but for reasons of stability must remain smaller than one.

For the calculation of the total noise figure it is necessary to have, in addition to the available power gain, also the signal transducer gain $L''_{u,deg}$ in the degenerated case. This is obtained from the conversion matrix with inclusion of the source and load resistances $R_S$ and $R_L$ as follows:

$$L''_{u,deg} = z/(p+z) 4 R_s R_L k [(1+b)/(1-b^2)]^2$$

where k is a constant which depends on the circuit losses and on the state of matching to the IF amplifier and, in the no loss and matched state, takes on the value one.

The parameter b has a value in the vicinity of one, similarly to a, and represents the deattenuation effect under consideration of the termination by the IF amplifier. For reasons of stability care must be taken that the relationship $$b < a < 1$$

is met.

The conversion behavior of the converter with respect to deterministic signals for which no fixed frequency and phase relationship exists between signal, pump and intermediate frequencies, is described by the conversion matrix for the five-frequency case of FIG. 1b.

The conversion process in this case is significantly more complicated than in the degenerated converter. The input frequency at $p+z$ is converted down to z. The component at frequency z forms with the pump signal at frequency p a conversion product at the lower sideband at frequency $p-z$, which due to $p \approx 2z$ lies in the vicinity of z. Finally a component at $2p-Z$ must also be considered which results from the process of mixing a signal component at frequency $p-z$ with the pumping signal at frequency p.

Higher order conversion products may become negligible if the reactance diode is operated in a current controlled mode concerning the pump signal (series resonance at p).

The transducer gain calculation from the quasidegenerated conversion matrix provides the following result:

$$L_{u,quasi} = z/(p+z) 4 R_s R_L k [1/1 - b^2]^2$$

i.e. a value which is less than the transducer gain in the degenerated case. The converter thus processes coherent and incoherent signals with different transducer gains. The relationship between these gains, the so-called quasidegenerated improvement factor, is thus:

$$V_{quasi} = L''_{u,deg}/L''_{u,quasi} = (1+b)^2$$

and, if b tends to go toward one, approaches a value of 4, i.e. 6 dB. These statements are again applicable for resonance and optimum phase relationships. Generally b is not real but is a complex frequency and phase dependent function.

The calculation of the noise properties is divided into two separate calculations: Firstly calculation of the excess noise figure of the converter which is determined by the conversion properties, the internal losses and the noise properties of the IF amplifier; and secondly, calculation of the transducer gain for noise signals, which is required to determine the actual improvement factor and which differs from the transducer gain for deterministic signals in the quasidegenerated case. If the input signal is perceived as a limited bandwidth, white noise signal which can be treated as the superposition of a plurality of incoherent harmonic signals, it can be shown that each spectral component of this noise signal is amplified, in principle, with the quasidegenerated transducer gain.

A more precise discussion shows, however, that because of the two possible input frequencies $p+z$ and $2p-z$, each spectral component on the IF side is composed of two components of the input noise. This double sideband consideration results, on a time average, in the noise signal transmission gain:

$$L_{u,r} = \frac{z}{p-z} 4 R_s R_L k \frac{1+b^2}{(1-b^2)^2}$$

so that the improvement factor is now:

$$V = \frac{L_{u,deg}}{L_{u,r}} = \frac{(1+b)^2}{1+b^2}$$

which for $b=1$ takes on the value of 2 i.e. 3 dB.

Both improvement factors have a significance that is clearly evident. The quasidegenerated improvement factor $V_{quasi}$ defines the interference carrier suppression of the receiving system: signals which do not lead to settling of the subsequent phase locked loop are weakened by 6 dB compared to the settled signals. The actual improvement factor V, in a converter assumed to have no noise, describes the improvement in the signal to noise ratio between input and output; it can thus be a maximum of 3 dB.

If the converter is not free of noise, the total noise figure as explained in U.S. Pat. No. 3,911,365 is:

$$F = 1/V(1 + F_z)$$

where V is the above-mentioned improvement factor, and $F_z$ is the excess noise figure of the converter.

In calculating the excess noise figure, particular consideration must be given the special frequency situation shown in FIG. 1b. Since intermediate frequency and image frequency coincide at the output of the converter, the pair of IF terminals thus being input and output terminals at the same time, the noise of the IF amplifier is not only included in the cascade noise figure for the converter and IF amplifier, but also in the excess noise figure of the converter by itself.

In the conversion equations all signal sources are set at zero and only influences from internal noise sources are considered. The noise of the IF amplifier is represented by an equivalent noise source at its input. A transformer is connected between the converter M and the IF amplifier V and has a transformation ratio that is selected so that the given converter output resistance is converted to the optimum noise resistance of the IF amplifier. Under these conditions, the converter has the following excess noise figure:

$$F_z = \frac{T_m}{T_A} \cdot \frac{R_{v,p+z} + R_{D+}}{R_{p+z}}$$

$$+ \frac{b}{1+b^2} \cdot \frac{p+z}{z} \left(1 + \frac{R_{v,p+z} + R_D}{R_{p+z}}\right) \left(\frac{R_{v,z} + R_D}{R_+}\right)$$

$$+ \frac{T_{ZF,Min}}{T_A} \cdot \frac{R_{E,ZF}}{u^2 R_+} \cdot \frac{b^2}{1+b^2} \left(1 + \frac{R_{v,p+z} + R_D}{R_{p+z}}\right) \frac{p+z}{z}$$

where
$T_m$ is the ambient temperature around the converter in °K.,
$T_A$ is the antenna temperature in °K.,
$T_{zf,Min}$ is the minimum noise temperature of the IF amplifier in °K.,
$R_{v,p+z}$ is the equivalent resistance of the signal circuit,
$R_{v,z}$ is the equivalent resistance of the IF circuit,
$R_D$ is the equivalent resistance of the reactance diode,
$R_{p+z}$ is the source resistance, and
$R_+$ is the attenuating resistance on the IF side.

Using real values for these parameters, it can be seen that with a sufficiently low-noise IF amplifier, $F_z$ will also not cause a significant worsening of the total noise figure.

For the case of frequency modulated input signals, the pump oscillator is also frequency modulated. This initially requires a more generalized treatment of the conversion characteristics of the reactance diode. It can be shown, however, that the conversion equations with following frequency modulated pump oscillator can be converted to the stationary equations for a pump oscillator with constant frequency. The conclusion is that up to increased bandwidth demands, no differences in principle exist between monochromatic and FM signal behaviour.

The particular conditions of the FM case, however, permit further improvements in the noise behaviour. Due to the pump following in rigid phase position, there exists a reduction in the frequency deviation from the HF to the IF plane the value of which is $\Delta f_z = \Delta f_{p+z} - \Delta f_p$. The immediate conclusion is that at the intermediate frequency the Carson bandwidth, which corresponds to the reduced modulation index, can be reduced without provoking distortion of the FM signal.

For the case with ideal filters, the result is, according to the disclosure of U.S. Pat. No. 3,911,365:

$$F = B_{ZF}/B_{HF} L''_{u,r}/L''_{u,deg}(1 + F_z)$$

where $B_{ZF}$ is the IF bandwidth and $B_{HF}$ is the HF bandwidth. With filters having real transmission curves, the respective noise bandwidth must be inserted into the equation at the corresponding locations.

FIG. 7 shows an arrangement in which the down converter has its input connected to a signal frequency bandpass filter having the bandwidth $B_{ZF}$ and its output connected to an intermediate frequency bandpass filter having the bandwidth $B_{ZF}$.

The further improvement in the signal to noise ratio is multiplicative since bandwidth compression and different amplifications of signal and noise are uncorrelated processes, i.e. can be utilized separately.

The magnitude of the attainable improvement depends on the modulation index, the LF bandwidth requirement and the series-connected demodulator and can reach a maximum value of $(p+z)/z = 3 = 4.7$ dB.

The advantageous system properties of the coherent phase down converter disclosed herein can be utilized as the basis for a series of receiving systems.

For example, as shown in FIG. 5, a conventional low noise preamplifier can be connected ahead of the degenerated parametric down converter via a circulator connected to the down converter as shown in FIG. 3. If the preamplifier has a sufficient available gain and a low noise figure, the total noise figure of the receiver input circuit is given by:

$$F = \left.\frac{L_{u,r}}{L_{u,deg}}\right|_{Converter} (1 + F_z)\Big|_{Preamplifier}$$

i.e., the noise characteristics with respect to internal sources are determined by the preamplifier, the converter retains its improvement factor, and the cascade circuit is thus a system in which F < 1. This configuration has the advantage that the converter need not be noise optimized, which results in a larger number of degrees of freedom and which can be utilized, for example, to increase the converter bandwidth.

In the microwave range sufficiently low-noise preamplifiers are not available. In this case, for example, the parametric down converter with a real terminating resistance at the image frequency, as disclosed in U.S. Pat. No. 3,991,373, can be used as a preliminary stage, as shown in FIG. 6 where the converter is supplied with a pump signal at frequency q. It has an available power gain which is greater than one and, with high conversion ratio, has a noise temperature $$T_m = (p+z)/(p-z) a \, T_{sp} \approx T_{sp}$$

where $T_{sp}$ is the noise temperature of the terminating resistance at the image frequency. If, with a sufficiently high conversion ratio in such a system, the antenna is also used as a terminating resistance at the image frequency, it is possible to attain very low noise temperatures at high antenna elevation angles i.e. ($T_A = 50°$ K.). The connected converter can thus fully utilize its improvement factor.

The receiver input circuit according to the present invention is distinguished by the following characteristics:

upper sideband down converter with low pump frequency;
available power gain $>1$
low internal noise factor $<1$
improvement of the signal to noise ratio
usable for FM
upper frequency limit determined by available varactor diode technology.

Thus, system thresholds in the vicinity of 0 dB can be expected with a high degree of certainty. This means that there is a decisive improvement over the presently existing marginal values for satellite receiving systems, particularly with respect to satellite transmitting energy and maximum attainable distance ranges.

As examples of the prior art relevant to systems according to the invention, there may be cited:

R. Maurer: The Signal and Noise properties of the degenerated and quasidegenerated nonreciprocal parametric amplifier without circulators AEÜ24 (1970), No. 9, pages 419–424;

R. Maurer and K. H. Löcherer: Parametric Microwave Converter, AEÜ26 (1972), No. 11, pages 475–480;

R. Maurer: Lower Sideband Parametric Converter with Frequency or Amplitude Modulated Signal and Pump Source, AEÜ26 (1972), No. 1, 1–10;

German Patent No. 2,230,536 and counterpart U.S. Pat. No. 3,991,373; and

German Patent No. 2,153,244 and counter U.S. Pat. No. 3,911,365.

U.S. Pat. No. 3,237,017.

FIG. 3 illustrates a 12 GHz synchronous receiver corresponding essentially to that shown in FIG. 2, and which can be constructed from commercially available components, examples of which are indicated on the Figure. The basic circuit arrangement shown in FIG. 3 differs from that of FIG. 2 only by the provision of a circulator connected between the antenna input, the voltage controlled oscillator and the degenerated down converter. In a practical embodiment of the circuit shown in FIG. 3, the circulator can be of a type having an insertion loss of less than 0.35 dB, the voltage controlled oscillator can be of a type having a high spectral purity, a high modulation sensitivity, high modulation rates up to 30 MHz, and an output power level of 30–100 mW. The IF amplifier can be selected to have a frequency range of 3.7–4.2 GHz, a very low noise figure (120°–250° K.), and a gain greater than 30 dB. The phase detector is of a type having a high tangential sensitivity, and the frequency divider is phase coherent.

FIG. 4a shows an equivalent circuit for the degenerated parametric down converter at low frequencies. This circuit includes a T-highpass signal frequency transformation network connecting the antenna resistance at the input of the converter and a Pi lowpass IF frequency transformation network via which the output of the converter is terminated by the input impedance of the IF amplifier. As is conventional, the converter includes a varactor as the active component and receives pump power at a center tap of the shunt inductance forming part of the T-highpass transformation network.

Figure 4B:
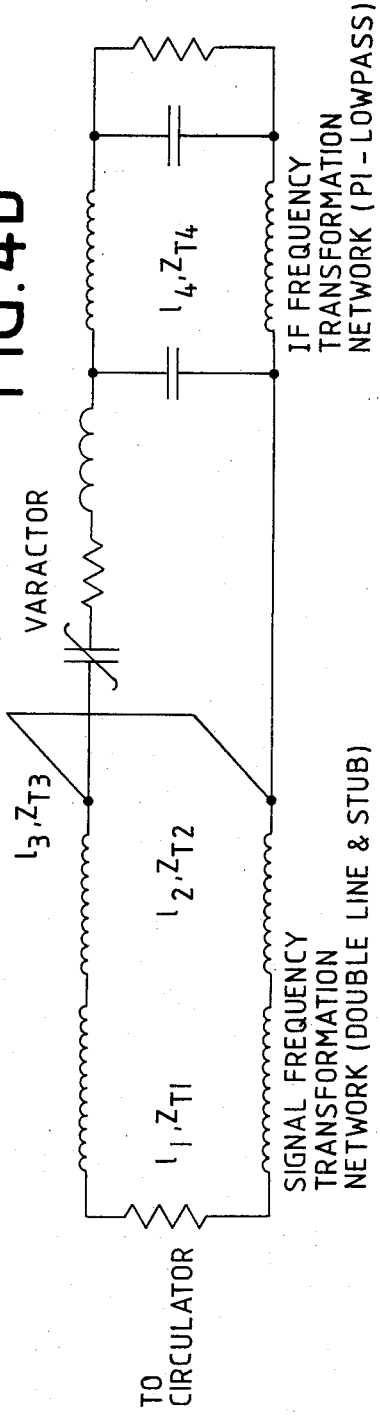

FIG. 4b is an equivalent circuit diagram of the converter in the microwave frequency region. The input of the converter is connected to the output of the circulator, as shown in FIG. 3, and signal frequency transformation is effected by a double line and stub network. Here again, a Pi lowpass IF frequency transformation network connects the output of the converter to the input of the associated IF amplifier.

It will be understood that the above description of the present invention is susceptible to various modifications, changes and adaptations, and the same are intended to be comprehended within the meaning and range of equivalents of the appended claims.

What is claimed is:

1. A receiver input stage comprising: an upper sideband parametric degenerated down converter for converting a high frequency input signal into an intermediate frequency signal; demodulating means having a signal input; a controllable oscillator connected in a control loop with said converter and said demodulating means for supplying said converter with a pump signal which follows the intermediate signal in frequency and phase and which has a frequency equal to twice the intermediate frequency such that the sum of the pump signal frequency and the intermediate frequency equals three times the intermediate frequency; and means for terminating said converter, connecting the output of said converter to said demodulating means signal input, and defining a real resistance at the converter reflective frequency, where the reflective frequency is the difference between the pump signal frequency and the intermediate signal frequency whereby said circuit has an available power gain greater than unity and an improved signal to noise ratio for the intermediate frequency signal at said signal input of said demodulating means.

2. Receiver input circuit as defined in claim 1 further comprising a low noise preamplifier connected to the input of said converter without deteriorating the improvement factor of said converter.

3. Receiver input circuit as defined in claim 1 for receiving microwave signals, further comprising a second parametric down converter connected to the input of said first-recited converter and a source of a second pump signal connected to said second converter, with said second converter being associated with a real terminating resistance at the reflective frequency of said second converter, which reflective frequency is equal to the sum of the frequencies of the first-recited pump signal and the second pump signal less the intermediate signal frequency.

4. Receiver input circuit as defined in claim 1, 2 or 3 for receiving a frequency modulated input signal wherein said demodulating means is constituted by a phase detector, and said means for terminating said converter comprises an IF amplifier connected between said phase detector and said upper sideband converter, and further comprising a lowpass filter connected to the output of said demodulating means for providing a low frequency signal and means supplying the low frequency signal from said filter to said oscillator for controlling said oscillator.

5. Receiver input circuit as defined in claim 4 wherein said upper sideband converter comprises means connected for causing the bandwidth of the intermediate frequency signal to be smaller than that of the high frequency signal.

* * * * *